United States Patent [19]

Sawyer

[11] 3,939,895
[45] Feb. 24, 1976

[54] METHOD FOR CASTING DIRECTIONALLY SOLIDIFIED ARTICLES

[75] Inventor: Thomas F. Sawyer, Ballston Lake, N.Y.

[73] Assignee: General Electric Company, Schenectady, N.Y.

[22] Filed: Nov. 18, 1974

[21] Appl. No.: 524,396

[52] U.S. Cl. .................. 164/60; 164/127; 164/136
[51] Int. Cl.² ......................................... B22D 25/06
[58] Field of Search ............ 164/60, 103, 104, 105, 164/106, 107, 125, 126, 127, 136, 338, 348

[56] References Cited
UNITED STATES PATENTS

| | | |
|---|---|---|
| 3,170,205 | 2/1965 | Brown.................................. 164/60 |
| 3,793,012 | 2/1974 | Walter et al........................... 75/171 |
| 3,793,013 | 2/1974 | Walter et al........................... 75/171 |
| 3,847,203 | 11/1974 | Northwood........................... 164/60 |
| 3,857,436 | 12/1974 | Petrov et al. .......................... 164/60 |

*Primary Examiner*—Frank S. Husar
*Assistant Examiner*—John E. Roethel
*Attorney, Agent, or Firm*—F. Wesley Turner; Joseph T. Cohen; Jerome C. Squillaro

[57] ABSTRACT

The invention relates to a method of casting superalloy articles and more particularly to directionally solidifying eutectic superalloy compositions to produce a composite structure of a superalloy matrix reinforced with aligned carbide fibers.

7 Claims, 1 Drawing Figure

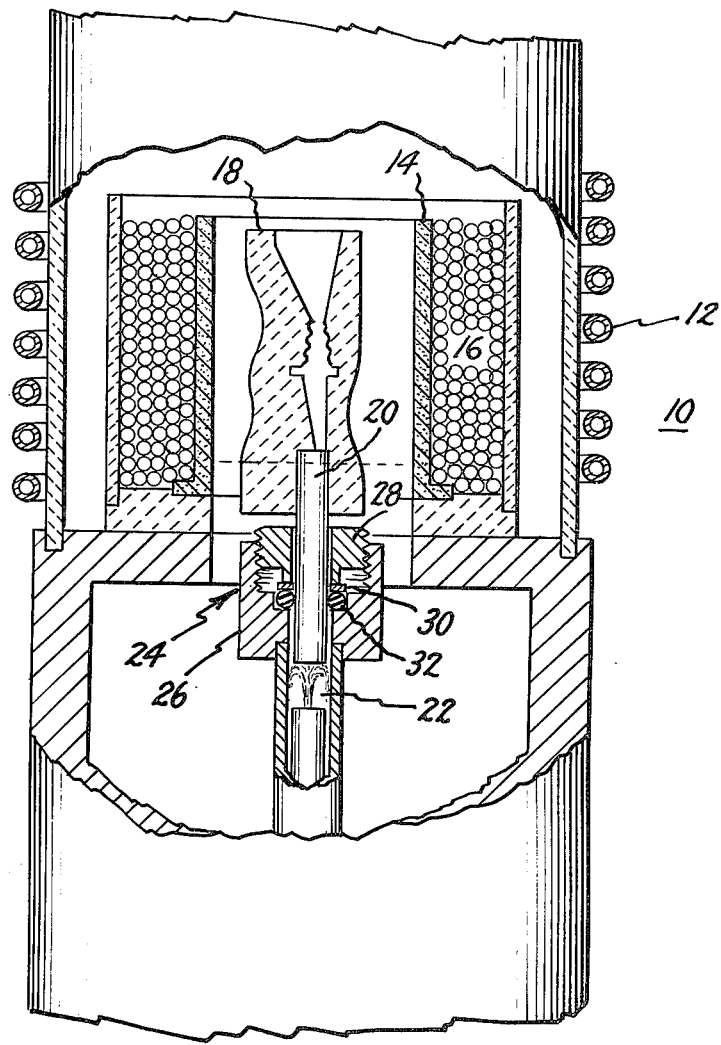

METHOD FOR CASTING DIRECTIONALLY SOLIDIFIED ARTICLES

Superalloys are heat resistant materials having superior strength and oxidation resistance at high temperatures. Many of these alloys contain iron, nickel or cobalt alone or in combination as the principal element, together with chromium to impart surface stability and usually containing only one or more minor constituents such as molybdenum, tungsten, columbium, titanium and aluminum for the purpose of effecting strengthening. The physical properties of the superalloys make them particularly useful in the manufacture of gas turbine components.

The strength of superalloys is determined in part by their grain size. At low temperatures fine grained equiaxed structures are preferred. At high temperatures large-grained size structures are usually found to be stronger than fine-grained. This is believed related to the fact that failure generally originates at grained boundaries oriented perpendicular to the direction of the induced stress. An improved technique for casting superalloys used in gas turbine engines was developed by Ver Snyder, U.S. Pat No. 3,260,505 which discloses the preparation of a blade having an elongated columnar structure with unidirectional crystals aligned substantially parallel to the long axis of the blade. This procedure involves directional solidification whereby almost a complete elimination of grained boundaries normal to the primary stress axis occurs. A further advance was made by Piearcy, U.S. Pat. No. 3,494,709 wherein grained boundaries in superalloys were eliminated by making single crystal castings.

Directional solidification to produce columnar casting and the apparatus used for this purpose are described in *The Superalloys*, Edited by C. T. Sims et al., John Wiley & Sons, (1972), Pages 479–508. Columnar grains are formed when the melt temperature is greater than the freezing temperature and when the flow of heat is unidirectional from the liquid through the solid. Typically a ceramic inventment casting mold is attached to a water-cooled copper chill plate and placed in an induction-heated graphite susceptor. The mold is heated above the melting point of the alloy being cast and the superheated melt is poured into the mold. Heat enters the upper portion of the mold by radiation from the susceptor and is removed through the solidified metal by the chill at the bottom. Thus, solidification occurs in an upward direction through the casting and the rate of solidification is a function of the amount of heat entering at the top of the casting and the amount of heat extracted from the casting through the solid. In the Stockbarger method the furnace heat-flow configuration requires a sharp temperature difference between the lower and upper furnace portions which is provided by a baffle. The mold is gradually withdrawn through the baffle so that the solid-liquid interface remains essentially parallel with the plane of the baffle.

The temperature gradient in any directional solidification apparatus is a major factor which regulates the maximum rate unidirectional solidification can occur while maintaining good phase alignment throughout the length of the ingot. An increase in growth velocity requires an increase in temperature gradient in order to maintain the same temperature gradient to growth velocity. The Bridgman-type apparatus has been used to produce acceptable phase alignment of certain alloys but only at very low solidification rates of about ¼inch per hour. Here the susceptor is heated inductively, which melts the charge in the crucible. After equilibrium is established, the mold assembly is lowered out of the heat zone and nucleation of solid occurs in the bottom of the crucible. Directional freezing continues upward as the mold unit is lowered. Faster rates at this inherent temperature gradient introduces structure breakdown to cellular and/or dendritic morphologies which deleteriously affects the properties. Bottomless crucibles which allow contact between the ingot and a copper chill have increased the allowable solidification but the heat path may still be interrupted by oxide formation at the contact site or poor contact between the ingot and the chill due to surface roughness, lack of alignment or separation due to shrinkage of the ingot during cooling.

The conditions at the chill face are critical for proper unidirectional heat flow. The chill must be water cooled and have a high thermal conductivity. The surface of the chill must be cleaned before each casting run so that resistance to heat flow by oxide layers is minimized. Difficulties in obtaining uniform heat transfer at the chill face require that the mold be securely clamped to the chill plate. A major problem with this method is that solidification rate and temperature gradient decrease with distance from the chill.

It is therefore an object of the present invention to overcome the deficiencies of the prior art by establishing a direct heat flow path from the solid-liquid interface to the coolant media.

In accordance with the invention, I have discovered a method of producing directionally solidified cast alloy article in a shell mold. The method includes providing a mold having a cavity divided into an upper portion and a lower portion, the mold being disposed in a heating zone, placing one end of a longitudinal heat extractor element of said alloy into the lower portion of the cavity, said other end of said heat extractor extending therefrom and being exposed to a continuous flow of fluid coolant, heating said mold and said one end of said heat extractor placed therein at a temperature above the melting range of said alloy to melt a portion of said one end of the heat extractor, filling the mold with said alloy in a molten state, controllably lowering said mold out of the heating zone to allow the mold and the contents thereof to cool and to establish directional solidification of the alloy in said cavity. The essential improvement of my apparatus is that the heat extractor is a solid bar formed from the same alloy as the casting and provides direct cooling by the fluid coolant. A separate chill plate with the problems created by its use is thereby avoided.

The invention is more clearly understood from the following description taken in conjunction with the accompanying drawing which is a sectional view through a mold showing the invention.

In the Fig., the furnace 10 conventionally used for directional solidification is heated from outside by induction heating coils 12. Within the furnace 10 is a susceptor 14 comprised of graphite or a similar material which is insulated with an insulation 16 of a ceramic material. Disposed within the susceptor is a shell mold 18 which in this instance is shaped to produce a gas turbine blade. The top portion of the mold is provided with an opening into which the molten alloy may be poured, while the bottom portion of the mold is adapted to insert a heat extractor element 20 of an identical alloy which is water cooled at its bottom through channels located at 22. At an intermediate location on the heat extractor element 20 there is a water-tight seal 24 which also firmly mounts the element 20 to a moveable platform 26 arranged to permit vertical movement with respect to the furnace 10. A representative seal 24 such as a compression seal is illustrated having a compression screw 28 acting against a spacer 30 and an O-ring 32.

In the operation of the furnace the heat extractor 20 is first mounted in the position shown by means of the seal 24 and inserted into the shell mold 18. The mold assembly is then preheated to a sufficiently high temperature to insure melting the tip of the heat extractor, while at the same time water cooling is established. The power setting and position of the mold assembly in the susceptor will govern the length of the melt-back into the heat extractor. When the predetermined settings have allowed the system to equilibrate, the desired alloy is melted in a crucible positioned above the mold using a separate power source.

The entire mold assembly is then lowered at a preselected rate utilizing the illustrated drive withdrawal mechanism. The solid liquid interface will advance upward as heat is conducted directly through the heat extractor and carried away by water flowing through the coaxial water header.

Using the apparatus and method of the present invention, unidirectionally solidified nickel-base carbide reinforced cast superalloy bodies having high strength and high stress rupture properties particularly at elevated temperatures have been prepared as disclosed by Walter et al., U.S. Pat. No. 3,793,012. The reinforced fibers present in the matrix were aligned single crystal fibers of metal monocarbides. The range of compositions of the unidirectionally solidified castings in weight percent was reported to be about 6.5–10% chromium, 14–23% tantalum, 0.5–1.5% carbon, up to 6% aluminum, up to 1% titanium, up to 8.5-% cobalt, up to 5.0% molybdenum, and the balance essentially nickel. A preferred composition, designated as TaC-1900 had high strength and high stress-rupture properties. The nickel-base superalloy can also be modified as disclosed by Walter, U.S. Pat. application Ser. No. 482,589, filed June 24, 1974, and having the same assignee as the instant application, to include by weight at least 2% rhenium, and at least 6% tungsten, but containing less than 5% aluminum and less than 7% chromium and an aligned reinforced fibrous phase of tantalum monocarbide embedded in the matrix.

Other alloys which can be employed in my process are cobalt-base tantalum carbide eutectic alloys as disclosed by Walter et al, U.S. Pat. No. 3,793,013 and having a composition in weight percent of up to 26% chromium, 13.5–19.0% tantalum, up to 10.0% nickel, up to 6.5% tungsten, up to 1% iron, 1.2–1.5% carbon and the balance essentially cobalt.

It will be appreciated that the invention is not limited to the specific details shown in the illustrations and that modifications may be made within the ordinary skill in the art without departing from the spirit and scope of the invention.

I claim:

1. A method of producing a directionally solidified cast alloy article in a shell mold, said method comprising providing a mold having a cavity divided into an upper portion and a lower portion, said mold being disposed in a heating zone, placing one end of a longitudinal heat extractor element of said alloy into the lower portion of the cavity, said other end of said heat extractor extending therefrom and being exposed to a continuous flow of fluid coolant, heating said mold and said one end of said heat extractor placed therein at a temperature above the melting range of said alloy to melt a portion of said one end of the heat extractor, filling said mold with said alloy in a molten state, and controllably lowering said mold out of the heating zone to allow said mold and contents thereof to cool and to establish directional solidification of the alloy in said cavity.

2. The method of claim 1, wherein said alloy is a nickel-base superalloy.

3. The method of claim 2, wherein said alloy contains tantalum and carbon in an amount sufficient to form tantalum monocarbide fibers during directional solidification.

4. The method of claim 1, wherein said alloy is a cobalt-base superalloy.

5. The method of claim 4, wherein said alloy contains tantalum and carbon in an amount sufficient to form tantalum monocarbide fibers during directional solidification.

6. The method of claim 1, wherein said heat extractor is exposed to a continuous flow of water coolant and wherein the heat extractor is mounted to a moveable platform by means of a fluid tight seal.

7. The method of claim 1, wherein said mold is shaped to produce a gas turbine blade.

* * * * *